(12) United States Patent
Nam et al.

(10) Patent No.: US 8,043,735 B2
(45) Date of Patent: Oct. 25, 2011

(54) RECHARGEABLE BATTERY, PRINTED CIRCUIT BOARD THEREFOR, AND METHOD OF FABRICATING THE SAME

(75) Inventors: Sang Kwon Nam, Yongin-si (KR); Bo Hyun Byun, Yongin-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 1569 days.

(21) Appl. No.: 11/370,845

(22) Filed: Mar. 9, 2006

(65) Prior Publication Data

US 2006/0227521 A1   Oct. 12, 2006

(30) Foreign Application Priority Data

Mar. 9, 2005   (KR) .................. 10-2005-0019830

(51) Int. Cl.
  *H01M 14/00*   (2006.01)
  *H01M 2/26*   (2006.01)
  *H01R 9/00*   (2006.01)
  *H05K 7/00*   (2006.01)
(52) U.S. Cl. ............ 429/7; 429/121; 361/772; 361/777; 361/780
(58) Field of Classification Search .............. 429/218.1
See application file for complete search history.

(56) References Cited

U.S. PATENT DOCUMENTS

| | | | |
|---|---|---|---|
| 6,432,291 B1 * | 8/2002 | Vivares et al. | 205/125 |
| 6,861,821 B2 | 3/2005 | Masumoto et al. | |
| 2004/0251872 A1 * | 12/2004 | Wang et al. | 320/112 |
| 2005/0153195 A1 * | 7/2005 | Han | 429/59 |
| 2005/0217895 A1 * | 10/2005 | Maharshak et al. | 174/262 |

FOREIGN PATENT DOCUMENTS

| | | | |
|---|---|---|---|
| CN | 1 465 109 A | | 12/2003 |
| JP | 2001268808 A | * | 9/2001 |
| KR | 20030091172 A | * | 12/2003 |

OTHER PUBLICATIONS

Machine translation of KR 20030091172 A, Lee et al., Dec. 2003.*
Anami et al., Machine translation of JP 2001268808 A, Sep. 2001.*

* cited by examiner

*Primary Examiner* — Basia Ridley
*Assistant Examiner* — Sean P Cullen
(74) *Attorney, Agent, or Firm* — Lee & Morse, P.C.

(57) ABSTRACT

A method of fabricating a rechargeable battery having an electrode assembly, a PCB and a battery case, wherein the electrode assembly is connected to the PCB, the method including preparing a PCB having a first surface with an external contact terminal formed thereon and having a second surface with a conductive feature formed thereon, wherein the conductive feature is electrically connected to the external contact terminal through a conductive trace, and plating the external contact terminal by electrically connecting a plating electrode to the conductive feature.

7 Claims, 4 Drawing Sheets

RECHARGEABLE BATTERY, PRINTED CIRCUIT BOARD THEREFOR, AND METHOD OF FABRICATING THE SAME

BACKGROUND OF THE INVENTION

1. Field of the Invention

The present invention relates to a rechargeable battery. More particularly, the present invention relates to a rechargeable battery, a printed circuit board for the same and a method of fabricating the rechargeable battery.

2. Description of the Related Art

Recently, many types of high-capacity rechargeable batteries have been developed. Representative examples of widely-used rechargeable batteries include, e.g., nickel metal hydride (Ni-MH) batteries, lithium (Li) polymer batteries, and lithium ion (Li-ion) batteries. Rechargeable batteries are formed of a bare cell, or multiple bare cells, encased in a battery case, wherein each bare cell has electrodes, e.g., an anode and a cathode, and an electrolyte.

Rechargeable batteries may store a large amount of energy when in a charged state. Further, the rechargeable batteries may be capable of delivering the stored charge rapidly, i.e., they may be capable of a high current output. While desirable for the intended use, the presence of this large amount of stored energy may prove hazardous if the battery is mishandled or malfunctions.

During charging, the rechargeable battery is typically charged with energy from an external energy source, e.g., an external electrical supply. The external energy source may be capable of delivering large amounts of energy to the rechargeable battery in a short period of time. Thus, the recharging operation has the potential to generate hazardous conditions under certain circumstances. For example, if a charged rechargeable battery is short-circuited, or a short circuit occurs during charging, a large amount of the stored energy of the rechargeable battery may be output abruptly and rapidly. This can result in hazards such as fires or explosions.

In order to reduce the risk of such hazards, various safety devices may be provided for the rechargeable battery. When an abnormal current or voltage of the rechargeable battery is detected, e.g., due to an increase in temperature, excessive charging or discharging, etc., the safety devices can block the output of abnormal current from the rechargeable battery or otherwise prevent the development of dangerous conditions. As one type of the safety device, a separator or a vent may be provided to the bare cell of the rechargeable battery. Other types of safety devices may also be provided, external to the bare cell. For instance, a protective circuit may be provided external to the bare cell.

The protective circuit may be connected to at least one electrode terminal of the bare cell via one or more conductive members. The protective circuit may be configured to detect abnormal current or voltage and block the abnormal current or voltage, in order to prevent excessive charging or discharging of the battery. Other types of safety devices may also be provided, e.g., positive temperature coefficient (PTC) devices, fuses, bimetallic members, etc., which operate by reacting to excessive heat caused by abnormal current.

The bare cell and the safety device(s) may be enclosed in a case to complete the rechargeable battery. In some instances, the safety devices may be mounted on a printed circuit board (PCB), which may also include various other active and passive devices related to battery charging, monitoring, status, etc. The PCB may be physically bonded to the bare cell using, e.g., a resin, which is known as a hot melt method.

The PCB may be a multi-layered PCB, having the two major exterior surfaces formed of conductive layers and one or more interior conductive layers interleaved with a plurality of insulating layers. Conductive traces may be formed from the interior conductive layer, and conductive features such as contact terminals, bonding terminals, and conductive traces may be formed on the two exterior conductive layers. The contact terminals may be used for, e.g., making reversible contact between the board and an external charging apparatus, a portable electronic device, test probes, etc. The bonding terminals may be used for soldering various components to the PCB, e.g., wires, integrated circuit chips (ICs) and other active devices, passive devices such as resistors, etc. The bonding terminals may also be provided on the interior conductive layer, with the components being soldered thereto using through holes or blind vias.

Further details of a typical protective circuit and associated PCB will now be described. In general, an external contact terminal may be formed on an outer surface of the PCB. The external contact terminal may be exposed to the outside of the rechargeable battery case and may be used to, e.g., reversibly electrically connect the battery to an external energy source, e.g., an electric supply, electronic battery charger, etc., in order to charge the battery. The external contact terminal may be formed on a first surface of the PCB, i.e., an outer or exposed surface. The protective circuit may be mounted to a second surface of the PCB, i.e., an internal surface, so as to be enclosed in the battery case.

FIG. 1 illustrates a schematic plan view of an outer surface of a conventional rechargeable battery PCB, and FIG. 2 illustrates a schematic plan view of an opposite or inner surface of the PCB of FIG. 1. Referring to FIG. 1 the outer surface of the PCB 10 may include one or more exposed external contact terminals 20, which, as noted above, may be used to couple the battery to a charging apparatus. Referring to FIG. 2, the inner surface of the PCB 10 may include conductive features 30 and 40. Conductive features 40 may be, e.g., bonding terminals.

The external contact terminal 20 may be disposed on the outer surface of the PCB and may be exposed to the exterior of the rechargeable battery. To reduce the contact resistance between the external contact terminal 20 and an external apparatus in contact therewith, the external contact terminal 20 may be plated with, e.g., with gold or silver.

In order to plate the external contact terminal 20, a plating electrode of a plating power supply may be connected to the external contact terminal 20. However, if the plating electrode is placed in direct contact with the external contact terminal 20, a portion of the external contact terminal 20 under the plating electrode may not get plated, or uniform plating may be difficult to attain. Therefore, the conventional PCB 10 may utilize a plating lead-in line 22, which may extend across the outer surface of the PCB 10 from the external contact terminal 20. The plating electrode may then be coupled to the plating lead-in line 22 at some distance from the external contact terminal 20, thereby providing the necessary electrical connection to the external contact terminal 20 while avoiding marring the plating thereof.

In detail, a plurality of the plating lead-in lines 22 may be provided, each of which is connected to an external contact terminal 20. The plating lead-in lines 22 may be formed in a branch or tree pattern. That is, a main plating lead-in line may be provided for connection with the plating electrode, and the main plating lead-in line may then split or branch into a plurality of plating lead-in lines 22, each individually connected to an individual external contact terminal 20. The main plating lead-in line may be located in on a region of the surface of the PCB 10 that allows for connection with the plating electrode without affecting the plating of the external contact terminal 20. Additionally, before the plating process, some portions of the PCB 10 may be excluded from plating by covering them with a solder mask, such that they are protected from the plating solution, while the external contact terminal 20 and at least some of the plating lead-in line 22 is exposed, so as to be plated.

After the plating is complete, the plating lead-in line 22 tree structure may be sectioned by removing, e.g., cutting off, a portion of the PCB 10 that carries the lead-in lines. At least some portion of the tree structure may have to be removed in order to eliminate conductive pathways between the external contact terminals 20. Otherwise, short circuits will result from the plating lead-in lines 22 tying together multiple external contact terminals 20.

Finally, the resulting PCB 10 and the bare cell may be assembled and enclosed in the battery case. The PCB 10 and bare cell may be molded in the battery case so as to expose the external contact terminal 20.

A problem with the above-described approach is that portions of the plating lead-in lines 22 may not be completely removed. That is, referring to FIG. 1, portions of the plating lead-in lines 22 may not be completely removed from the PCB 10 and may remain around the external contact terminals 20. These remaining portions may give the external contact terminals 20 a defective appearance and/or cause short-circuits with adjacent conductive elements.

For example, in forming the rechargeable battery so that the external contact terminal 20 is exposed, the PCB 10 may be misaligned and some portions of the plating lead-in lines 22 may be exposed. Additionally, the portions of the plating lead-in lines 22 may be disposed next to the edge of the PCB 10, making them susceptible to short-circuits with conductive elements disposed adjacent to the PCB 10.

SUMMARY OF THE INVENTION

The present invention is therefore directed to a rechargeable battery, a printed circuit board therefore, and a method of fabricating the same, which substantially overcome one or more of the problems due to the limitations and disadvantages of the related art.

It is therefore a feature of an embodiment of the present invention to provide a rechargeable battery having an exposed external contact terminal that is plated and which is free of vestigial plating lead-in lines.

It is therefore another feature of an embodiment of the present invention to provide a method of fabricating a rechargeable battery that includes plating an external contact terminal of a PCB by providing a plating potential to a feature formed on an inner surface of the PCB.

At least one of the above and other features and advantages of the present invention may be realized by providing a method of fabricating a rechargeable battery having an electrode assembly, a PCB and a battery case, wherein the electrode assembly is connected to the PCB, the method including preparing a PCB having a first surface with an external contact terminal formed thereon and having a second surface with a conductive feature formed thereon, wherein the conductive feature is electrically connected to the external contact terminal through a conductive trace, and plating the external contact terminal by electrically connecting a plating electrode to the conductive feature.

The method may further include, before the plating, forming at least one plating lead-in line on the PCB, the plating lead-in line electrically connected to the conductive feature. Preparing the PCB may include preparing a full size PCB that includes the PCB and at least a second PCB, each PCB having a plating lead-in line formed thereon, and the plating lead-in lines may be electrically connected to a single plating lead in line on the full-size PCB. The method may further include, after the plating, sectioning the full size PCB to separate the PCBs, electrically connecting the PCB to the electrode assembly, and disposing the electrode assembly and the PCB in the battery case such that the external contact terminal of the PCB is exposed to the outside of the case. The conductive feature may be a bonding terminal, and plating the external contact terminal by electrically connecting a plating electrode to the conductive feature may involve applying an electric potential to the external contact terminal via the bonding terminal, the method further including soldering a component to the bonding terminal after the plating.

At least one of the above and other features and advantages of the present invention may also be realized by providing a rechargeable battery PCB including an exposed external contact terminal configured to be connected to an external charging apparatus, and a bonding terminal electrically connected to the external contact terminal through a conductive trace embedded in the PCB, the bonding terminal having a portion of a plating lead-in line disposed on the PCB and extending from an outer periphery of the bonding terminal to a peripheral edge of the PCB.

The external contact terminal may not include any portion of plating lead-in line. The external contact terminal may be formed on a first surface of the PCB, an outer periphery of the external contact terminal may not extend to a peripheral edge of the PCB, and the external contact terminal may have a layer plated on its exposed surface. The external contact terminal may be formed on a first surface of the PCB, and the bonding terminal and the portion of the plating lead-in line may be formed on a second surface of the PCB. An outer periphery of the bonding terminal may extend to meet the peripheral edge of the PCB.

At least one of the above and other features and advantages of the present invention may further be realized by providing a rechargeable battery including an electrode assembly having an electrode, a case accommodating the electrode assembly, and a PCB electrically connected to the electrode, wherein the PCB has an exposed external contact terminal on a first surface, the external contact terminal configured to be connected to an external apparatus, an outer periphery of the external contact terminal does not meet a peripheral edge of the PCB, and the external contact terminal has a layer plated on its exposed surface.

The external contact terminal may be electrically connected to a bonding terminal through a conductive trace embedded in the PCB, and an outer periphery of the bonding terminal is extended to meet the peripheral edge of the PCB. The external contact terminal may be formed on a first surface of the PCB, and the bonding terminal may be formed on a second surface of the PCB.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Figure 1:
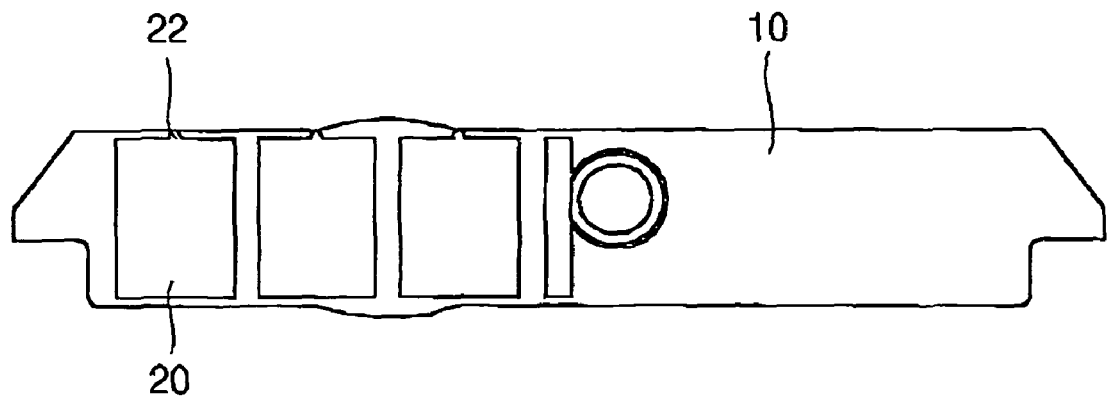
FIG. 1 illustrates a schematic plan view of an outer surface of a conventional rechargeable battery PCB.
Figure 2:
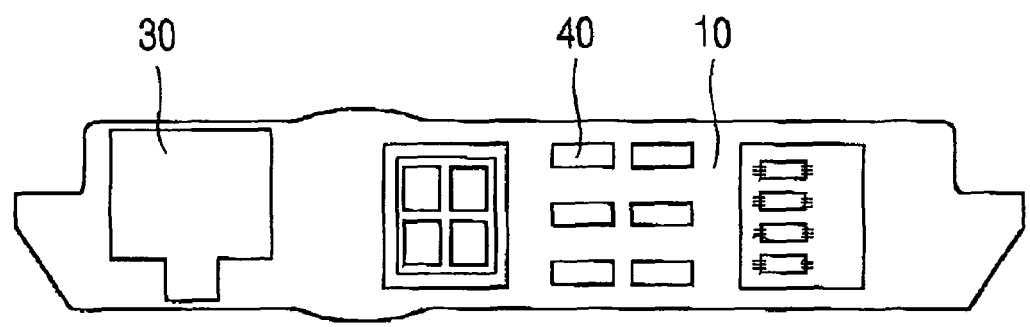
FIG. 2 illustrates a schematic plan view of an opposite or inner surface of the PCB of FIG. 1.

Korean Patent Application No. 10-2005-0019830, filed on Mar. 9, 2005, in the Korean Intellectual Property Office, and entitled: "Rechargeable Battery, Circuit Board Therefore, And Method Of Fabricating the Same," is incorporated by reference herein in its entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of layers and regions are exaggerated for clarity of illustration. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

According to the present invention, plating lead-in lines may be omitted from the outer surface of a PCB around external contact terminals, and thus residual portions of the plating lead-in lines will not remain around the external contact terminals. Accordingly, a rechargeable battery according to the present invention may be less likely to short-circuit, and the appearance of defects resulting from exposed residual plating lead-in lines connected to the external contact terminals may be avoided.

Figure 3:
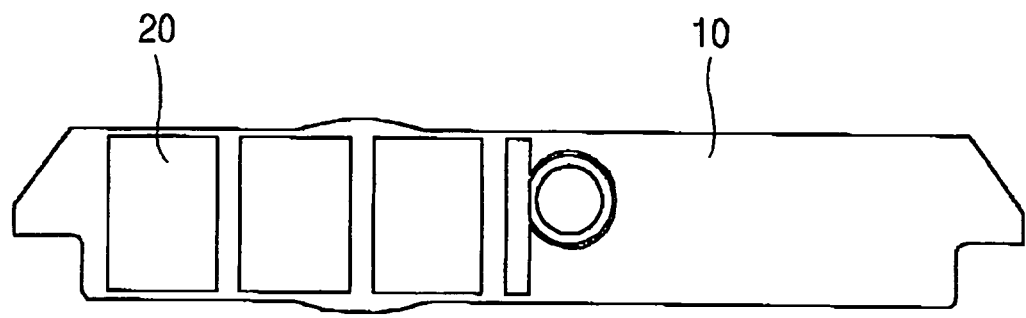
FIG. 3 illustrates a schematic plan view an outer surface of a rechargeable battery PCB according to an embodiment of the present invention.
Figure 4:
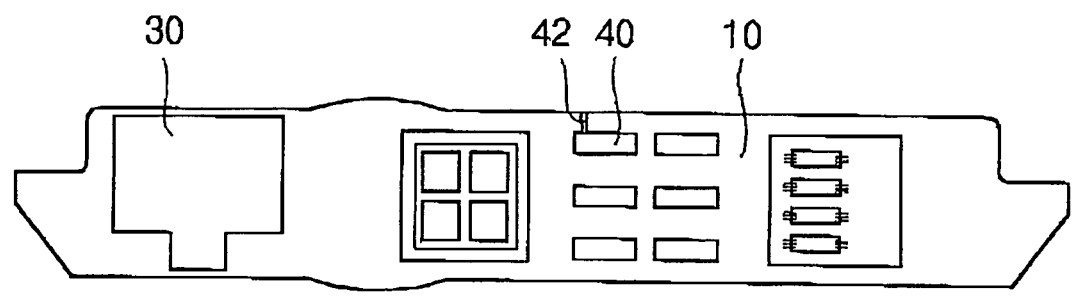
FIG. 4 illustrates a schematic plan view of an opposite or internal surface of the PCB of FIG. 3.

FIG. 3 illustrates a schematic plan view an outer surface of a rechargeable battery PCB according to an embodiment of the present invention, and FIG. 4 illustrates a schematic plan view of an opposite or internal surface of the PCB of FIG. 3.

In manufacturing a rechargeable battery PCB 10 according to the present invention, a full size PCB may be initially prepared. The full size PCB may be a large PCB including a plurality of simultaneously formed individual rechargeable battery PCBs 10. For example, a series of repeated wire patterns, for respective individual PCBs 10, may be formed in the full size PCB, and the full size PCB may then be sectioned, e.g., by sawing, into a plurality of individual PCBs 10. Thus, the individual PCBs 10 may be mass produced.

Each of the individual PCBs 10 may need to have portions thereof plated, e.g., the external contact terminals 20. Before the plating process, various components may already have been installed on the full size PCB. In order to protect these components, coating or molding may be performed on only the associated regions of the full size PCB, e.g., by using a dispenser to dispense the coating material on the components. Curing may be performed to remove solvent from the coating material and/or to improve characteristics of chemical structure of the coating material. The curing may be performed at a temperature of about 150° C. for a predetermined time.

Figure 5:
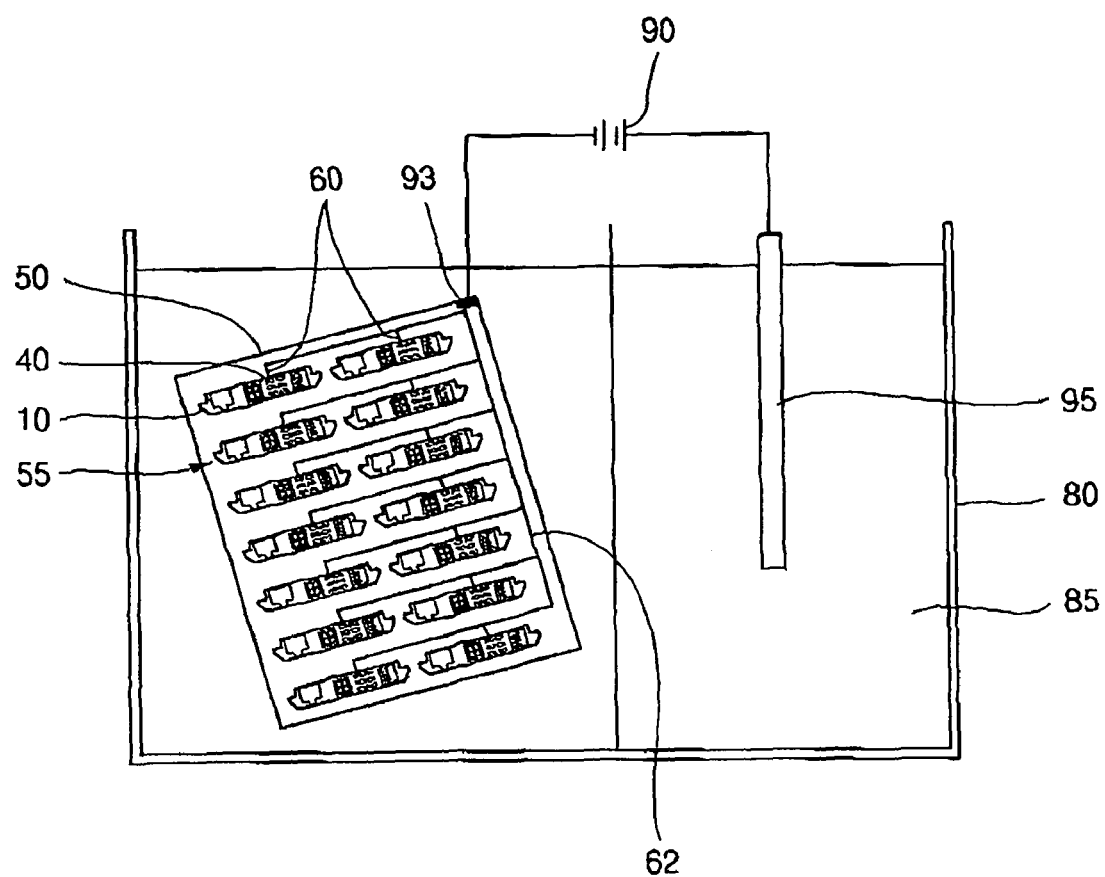
FIG. 5 illustrates a schematic view of a full size PCB dipped in an electrolyte bath for plating.

Referring to FIG. 5, a full size PCB 50 is dipped in an electrolyte bath 80 for plating. In order to plate the external contact terminals, multiple plating lead-in lines 60 may be required. A branched structure may be used for the multiple plating lead-in lines 60, such that multiple conductive features 40, both within an individual PCB 10 and across the full size PCB 50, may be tied together and coupled to the plating electrode 93. In other words, end portions of the plating lead-in lines 60 may be combined and connected to a single plating lead-in line 62, which is connected to the plating electrode 93 of the plating power supply 90 to apply an electric potential for plating to the external contact terminals by way of conductive features 40. Another plating electrode may be connected to a metal bar 95 immersed into a plating solution 85. The plating lead-in lines 60 may be formed on a dummy region 55 of the full size PCB 50, which may be removed by a cutting or punching process after the plating process. At this time, the individual PCBs 10 may also be separated. A solder mask or the like may be formed to cover those portions of the full size PCB 50 that are not to be plated.

According to the present invention, the plating lead-in lines need not be formed on the outer surface of the PCBs 10, where the external contact terminals 20 are disposed. Rather, they may be formed on an internal surface of the PCB 10, where the protection circuit and various other components may be disposed. In particular, the plating lead-in lines may be disposed on an inner surface of the PCB 10 and electrically connected to the external contact terminal 20 by way of conductive traces embedded in the PCB 10, i.e., conductive traces formed from one or more conductive layers internal to the PCB 10.

Referring to FIG. 3, the external contact terminal 20 may be formed on the outer surface of the PCB 10. The plating process may be performed in order to reduce the contact resistance of a contact between external contact terminal 20 and an external apparatus, e.g., a battery charger.

Referring to FIG. 4, one or more plating lead-in lines 42 may be formed on the inner surface of the PCB 10 and connected to one or more conductive features 40 on the inner surface of the PCB 10. The conductive feature 40 may be electrically connected to the external contact terminal 20 directly, by way of a conductive trace embedded in the PCB 10, or the conductive feature 40 may be electrically connected to the external contact terminal 20 indirectly, through one or more previously installed components mounted on the PCB 10.

In another implementation, e.g., where the individual PCB 10 is individually formed, i.e., not formed from a full-size PCB, the plating lead-in lines 42 may be omitted and a conductive feature 30 or 40 may have the plating electrode coupled directly thereto. The other of the conductive features 30 or 40 may be covered with solder mask or coating material to protect it from plating.

For example, the conductive feature 30 may be electrically connected to the external contact terminal 20, e.g., by a conductive trace or plated through-hole embedded in the PCB 10. Accordingly, the conductive feature 30 may be utilized in plating the external contact terminal 20. That is the conductive feature 30, which is connected to the external contact terminal 20, may serve as the plating lead-in line. The conductive feature 40 may be covered with solder mask or molding resin. As the conductive feature 30 is on an internal surface of the PCB 10, any marring effects of the plating electrode during the plating process will not affect the outer appearance of the rechargeable battery. Accordingly, the conductive feature 30 can be directly connected to the electrode of the plating power supply, and the plating lead-in line 42 may be omitted.

Figure 6:
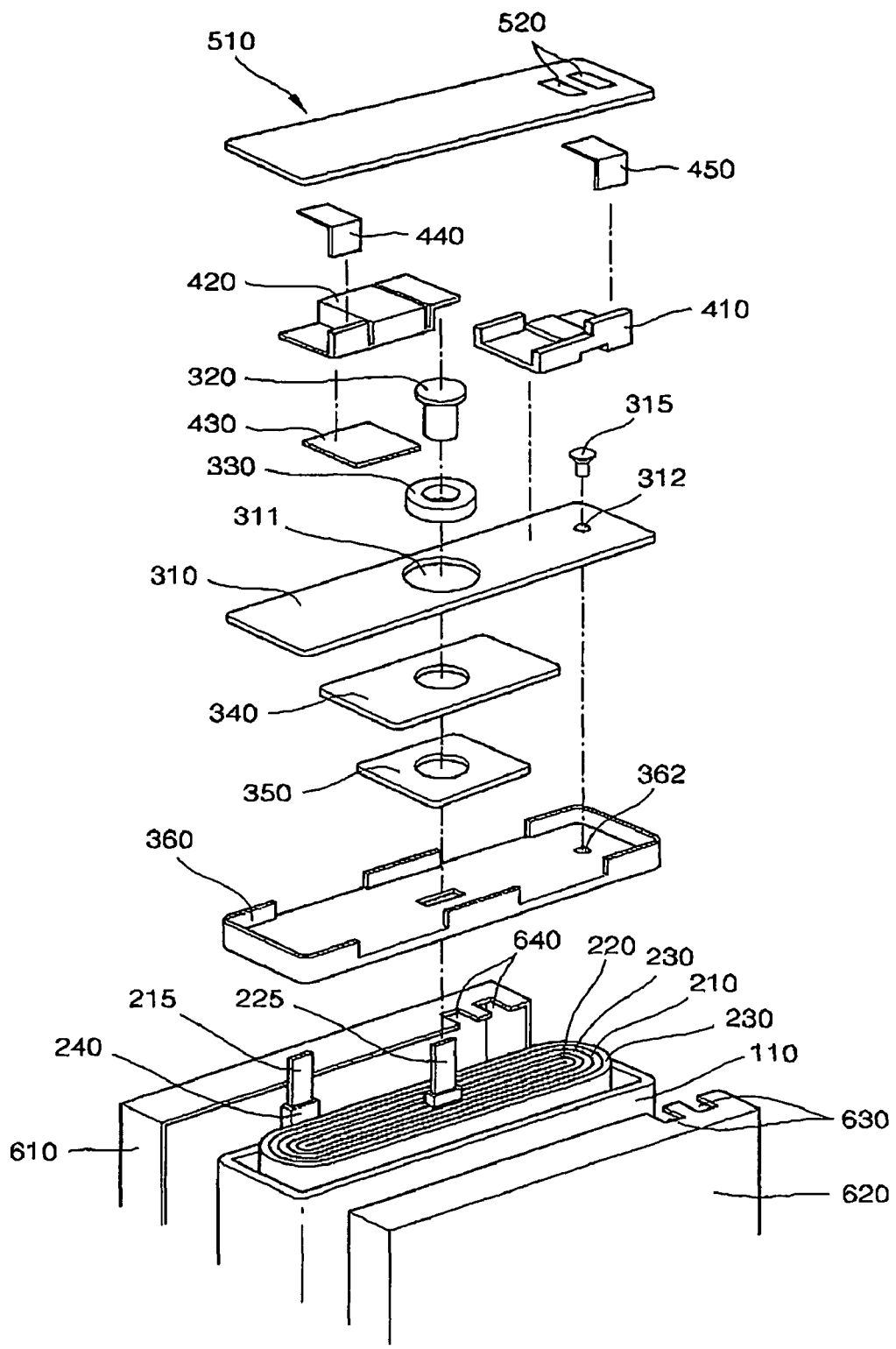
FIG. 6 illustrates a perspective view of a separated rechargeable battery according to an embodiment of the present invention.

FIG. 6 is a schematic perspective view of a lithium rechargeable battery according to one embodiment of the present invention. As shown in FIG. 6, a lithium rechargeable battery includes a battery case 110, a jelly-roll type electrode assembly contained in the battery case 110, and a cap assembly coupled to the top of the battery case 110.

The battery case 110 includes a metallic material and has an approximately square shape. The case 110 itself may act as a terminal.

The electrode assembly includes a first electrode plate 210 having a first electrode tab 215 (or positive electrode tab) attached thereto, a second electrode plate 220 having a second electrode tab 225 attached thereto, and a separator 230 positioned between the first and second electrode plates 210 and 220, respectively. The positive and negative electrode plates and the separator are laminated together and wound to form the electrode assembly. The electrode assembly is contained in the battery case 110. The portions of the first and second electrode tabs 215 and 225, respectively, which extend from the electrode assembly can be insulated from the electrode assembly by insulation tapes 240 to avoid short circuits between the first and second electrode plates 210 and 220, respectively.

The cap assembly includes a flat cap plate 310 sized and shaped to correspond to the opening of the battery case 110. The cap plate 310 has a terminal through-hole 311 at its center and an electrolyte injection hole 312 on one side for injecting an electrolyte. The electrolyte injection hole 312 is sealed by inserting a plug 315 in the hole 312.

The terminal through-hole 311 is positioned such that an electrode terminal 320 (for example, a negative electrode terminal) can be inserted through the through-hole 311. A tubular gasket 330 surrounds the electrode terminal 320, electrically insulating the terminal from the cap plate 310. An insulation plate 340 is positioned beneath the cap plate 310, and a terminal plate 350 is positioned between the insulation plate 340 and the opening of the battery case 110.

The electrode terminal 320 is inserted through the terminal through-hole 311. The gasket 330 surrounds the outer peripheral surface of the electrode terminal 320. The electrode terminal 320 extends through the insulation plate 340 and is electrically connected at its lower end to the terminal plate 350.

The first electrode tab 215, which extends from the first electrode plate 210, is welded to the lower surface of the cap plate 310, and the second electrode tab 225, which extends from the second electrode plate 220, is welded to the lower end of the electrode terminal 320.

An insulation case 360 is positioned over the opening of the battery case 110, and covers the electrode assembly. The insulation case 360 electrically insulates the electrode assembly from the cap assembly. The insulation case 360 has an electrolyte injection hole 362 corresponding in position to the position of the electrolyte injection hole 312 of the cap plate 310, enabling easy electrolyte injection. The insulation case 360 may include a polymer resin having insulative properties, for example polypropylene.

An insulation film 430 isolates a thermal breaker 420 connected to the cap plate 310. One tab of the thermal breaker 420 is connected to the electrode terminal 320 and the other tab of the thermal breaker is connected to lead plate 440, which is connected to one of the terminals of a PCB 510. The cap plate is connected to other terminal of the PCB 510 through lead plates 410 and 450. The terminal or the other terminal may be the conductive feature 40 of FIG. 4.

The PCB 510 has external contact terminals 520 and the surfaces of the contact terminals 520 are electroplated. The PCB 510, the electrode assembly and the case 110 including the cap assembly are encased in an outer battery case including half cases 610 and 620. The external contact terminals 520 are exposed to the outside through holes 630 and 640 formed in the half cases 610 and 620.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A rechargeable battery PCB, comprising:
an exposed external contact terminal configured to be connected to an external charging apparatus; and
a bonding terminal electrically connected to the external contact terminal through the PCB, the bonding terminal having a portion of a plating lead-in line disposed on the PCB and extending from an outer periphery of the bonding terminal to meet a peripheral edge of the PCB.

2. The rechargeable battery PCB as claimed in claim 1, wherein the external contact terminal does not include any portion of a plating lead-in line.

3. The rechargeable battery PCB as claimed in claim 1, wherein the external contact terminal is formed on a first surface of the PCB,
an outer periphery of the external contact terminal does not extend to a peripheral edge of the PCB, and
the external contact terminal has a layer plated on its exposed surface.

4. The rechargeable battery PCB as claimed in claim 1, wherein the external contact terminal is formed on a first surface of the PCB, and the bonding terminal and the portion of the plating lead-in line are formed on a second surface of the PCB.

5. A rechargeable battery, comprising:
an electrode assembly including an electrode;
a case accommodating the electrode assembly; and
a PCB electrically connected to the electrode, wherein:
the PCB has an exposed external contact terminal on a first surface, the external contact terminal configured to be connected to an external apparatus, and
a bonding terminal is electrically connected to the external contact terminal through the PCB, the bonding terminal having a portion of a plating lead-in line disposed on the PCB and extending from an outer periphery of the bonding terminal to meet a peripheral edge of the PCB.

6. The rechargeable battery as claimed in claim 5, wherein the external contact terminal has a layer plated on its exposed surface.

7. The rechargeable battery as claimed in claim 5, wherein the external contact terminal is formed on a first surface of the PCB, and the bonding terminal is formed on a second surface of the PCB.

* * * * *